(12) United States Patent
Quenzer et al.

(10) Patent No.: US 7,259,080 B2
(45) Date of Patent: Aug. 21, 2007

(54) GLASS-TYPE PLANAR SUBSTRATE, USE THEREOF, AND METHOD FOR THE PRODUCTION THEREOF

(75) Inventors: Hans-Joachim Quenzer, Itzehoe (DE); Arne-Veit Schulz, Hamburg (DE); Peter Merz, Hanerau-Hademarschen (DE)

(73) Assignee: Fraunhofer-Gesellschaft zur Forderung der Angewandten Forschung e.V., Munich (DE)

( * ) Notice: Subject to any disclaimer, the term of this patent is extended or adjusted under 35 U.S.C. 154(b) by 39 days.

(21) Appl. No.: 10/526,962

(22) PCT Filed: Aug. 22, 2003

(86) PCT No.: PCT/EP03/09328

§ 371 (c)(1),
(2), (4) Date: Jan. 9, 2006

(87) PCT Pub. No.: WO2004/030057

PCT Pub. Date: Apr. 8, 2004

(65) Prior Publication Data

US 2006/0110893 A1    May 25, 2006

(30) Foreign Application Priority Data

Sep. 6, 2002    (DE) ............................... 102 41 390

(51) Int. Cl.
*H01L 21/46* (2006.01)
*H01L 21/30* (2006.01)
*H01L 21/324* (2006.01)
*H01L 21/50* (2006.01)
*H01L 21/48* (2006.01)

(52) U.S. Cl. ...................... 438/455; 438/456; 438/457; 438/459; 438/795; 438/107; 257/E21.22

(58) Field of Classification Search ................ 438/455, 438/456, 457, 459, 795, 107
See application file for complete search history.

(56) References Cited

U.S. PATENT DOCUMENTS 6,030,829 A * 2/2000 Dannoux et al. ........ 435/288.3

FOREIGN PATENT DOCUMENTS

EP    199 56 654 A 1    6/2001
GB    2 241 233 A *    8/1991

\* cited by examiner

*Primary Examiner*—Michael Lebentritt
*Assistant Examiner*—Mohsen Ahmadi
(74) *Attorney, Agent, or Firm*—Antonelli, Terry, Stout & Kraus, LLP.

(57) ABSTRACT

The invented method is distinguished by a combination of the following method steps:
provision of a semiconductor planar substrate composed of a semiconductor material,
reduction of the thickness of the semiconductor planar substrate inside at least one surface region of the semiconductor planar substrate in order to form a raised surface region in relation to the surface planar region of reduced thickness,
structuring the raised surface region of the semiconductor planar substrate by means of local mechanical removal of material in order to place impressions inside the raised surface regions,
joining the structured surface of the semiconductor planar substrate with the glasslike planar substrate in such a manner that the glasslike planar substrate at least partially covers the surface planar region of reduced thickness,
tempering the joined planar substrates in such a manner that in a first tempering phase, which is conducted under vacuum conditions, the glasslike planar substrate covering the surface region of reduced thickness forms a fluid-tight bond with the surface region of reduced thickness, with the planar substrate covering the impressions in a fluid-tight manner under vacuum conditions, and that in a second tempering phase, at least partial areas of the glasslike material flow into the impressions of the structured surface of the semiconductor planar substrate.

39 Claims, 4 Drawing Sheets a)

GLASS-TYPE PLANAR SUBSTRATE, USE THEREOF, AND METHOD FOR THE PRODUCTION THEREOF

TECHNICAL FIELD

The present invention relates to a method for structuring a planar substrate made of a glasslike material.

PRIOR ART

As a material used in modern microelectronics or micromechanics, glass or glasslike materials have numerous advantages over other materials, particularly plastics, with regard to their low thermal expansion coefficients, which are comparable to those of semiconductor materials. Moreover, glass and glasslike materials possess high mechanical as well as chemical stability due to which these materials are of great significance in many technical fields.

However, very narrow limitations are set to the production, in particular, of technically very interesting products, especially to the production of micromechanical and microelectronical components made of glass as hitherto there are only few suited etching methods for microstructuring glass. As a result up to now only mechanical methods such as sawing, abrading, polishing, scratching, ultrasound and sand blasting have been used, thus greatly limiting the possibilities of structuring glass. However, these conventional processing methods do not permit structuring glass in the micrometer range and, in particular not in the sub-micrometer range with the precision demanded in semiconductor component technology.

As a consequence of these greatly limited structuring possibilities, microstructured bodies are often made of plastic. For example, DE 43 07 869 A1 describes a method in which the microstructured bodies are cast in plastic or in sinter materials by means of a mold. The microstructured mold is produced from a solid body made of metal, ceramics, glass, stone or a mono-crystalline material by fine-mechanical precision working, additive or subtractive structuring. Then the mold is filled with flowable material, covered and after consolidation, the material is separated from the mold. The microstructured body produced in this manner has, however, the drawback as well that it is made of a material with high thermal expansion coefficients and possesses, in comparison to glasslike materials, low mechanical and chemical stability.

A breakthrough in the technical limitations in processing glass would open new fields of application in which composite materials of silicon and glass would play a leading role. Such type composite elements could utilize the complementary properties of both materials. For example, compared to silicon, glass possesses very low electrical and thermal conductivity, however, contrary to silicon, it is optically transparent in the visible wavelength range.

Moreover, in addition to silicon, glass or glasslike materials play an important role in realizing micromechanical components. Especially with regard to encapsulating components on the wafer level, glass is often employed as an electrically insulating material. However, in this context, the aforementioned limitations are encountered in microstructuring.

In order to overcome the problems described in the preceding, DE 101 18 529, to which moreover this application is viewed as an application additional to patent, proposes joining a to-be-structured glasslike planar material with an already prestructured planar substrate made of a semiconductor material preferably by means of an anodic bonding procedure and heating this composite structure in such a manner that the glasslike material exceeds its flowing temperature and in this way flows into the prestructured impressions in the semiconductor planar material. Following corresponding tempering and subsequent cooling of the composite structure, the structured impressions in the semiconductor material are preferably completely filled with the glasslike material. After corresponding follow-up treatment of the cooled composite structure, the semiconductor material can be separated from the glass material in the impressions by means of selective material removal in order to ultimately obtain the desired structured components of glass material or glasslike material.

A key aspect of the method proposed in the aforementioned printed publication is the prestructuring of the semiconductor planar substrate, which is not only essentially responsible for the size, shape and dimensioning of the ultimately to-be-obtained structured glass product, but also contributes decisively to the costs of the method and thus to the cost of producing the desired product.

In a preferred embodiment, which is based on the technical teachings of DE 101 18 529, a semiconductor planar substrate is structured by means of an etching process as a silicon substrate, respectively as a silicon wafer, preferably impressions are placed selectively in the silicon wafer using a dry etching process. Although any desired contours can be placed in the silicon wafer in this manner, using dry etching techniques entail relatively high costs. In certain cases, for example in the production of periodic stamp structures, producing such type structures by means of sawing in using a wafer saw would be a considerably cheaper alternative, however such type material removal methods encounter the following problem:

In order to obtain a gas-tight boundary between the structured semiconductor wafer and the glasslike planar substrate required for the heated flowable, glasslike material to enter the impressions in the semiconductor planar substrate, the structuring of the silicon wafer by means of an etching process does not extend to the wafer edge. Notably the wafer edge is intentionally left unstructured while at the same time the target is almost full use of the silicon wafer area. If one however utilizes the, compared to the etching, distinctly less expensive sawing or milling techniques to structure the silicon wafer, it is impossible to leave out structuring the edge while striving to utilize the given wafer area as fully as possible for the structuring. Therefore, the method described in DE 101 18 529 does not permit obtaining a tight bond of the two substrates, for example by means of anodic bonding of the glass and the silicon substrate. A vacuum occlusion inside the cavities of the silicon wafer is therefore ruled out, which completely prevents filling the silicon structures when the glass is flowing.

DESCRIPTION OF THE INVENTION

The object of the present invention is to further develop the method for structuring a planar surface made of a glasslike material described in DE 101 18 529 in such a manner that the costs of the method are substantially reduced. It should be possible to replace the etching process required for prestructuring the semiconductor planar surface with a less expensive structuring technique. Moreover, all the advantages that can be achieved with the method according to DE 101 18 529 should be retained without limitations.

The solution to the object of the present invention is set forth in claims 1 and 2. The subject matter of claim 33 is a glasslike planar substrate produced and structured using the present method. Furthermore, preferred applications of the products, that can be produced with the method, are described. The subject matter of the subordinate claims and the description, in particular with reference to the figures, relate to features that advantageously further develop the inventive idea.

The invented method utilizes selective and cost-effective mechanical removal of material using sawing, milling or abrading techniques to structure the semiconductor planar substrate. Using the present method permits not only cost-effective large-scale production of semiconductor surfaces, as are common in industrial production, but also to realize small series at low cost, in particular in development, research and prototype production.

The purpose of the following invented method comprising the following steps is to be able to use the cost-effective structuring method successfully in connection with the fabrication of structured glasslike substrates or glass substrates:

First, a semiconductor planar substrate made of a semiconductor material, for example in the form of a silicon wafer is provided. Before the semiconductor planar surface is structured, the thickness of the semiconductor planar substrate is reduced in at least one surface region. Fundamentally, this reduction of the thickness can be carried out anywhere on the semiconductor planar surface. However, it is advantageous to reduce the thickness of the semiconductor planar substrate along the region of the edge. Generally, the peripheral edge region of a typical silicon wafer, which extends on the wafer surface approximately 3 mm from the rim of the wafer to the inside, is not at disposal for functional processing so that selective reduction of the thickness in particularly this edge region entails no drawbacks with regard to loss of technically valuable processing areas. Thickness reduction occurs in an especially valuable manner along the entire rim of the semiconductor planar substrate, respectively, to stay with the particular case of a silicon wafer, along the entire edge of the wafer. Thus, there remains, in relation to the edge region of reduced thickness, a large raised surface area in the middle of the wafer. The raised surface region is surrounded by a lateral boundary area of just the height, in relation to the edge region of reduced thickness, corresponding to the depth of removal that the edge region was thinned, respectively was reduced in thickness.

The reduction in thickness preferably occurs by means of a wet chemical etching process. However, suited mechanical material removal methods, such as for instance abrasion, can also be used.

Providing an edge region of reduced thickness at the peripheral rim of the wafer plays a particular role for the subsequent structuring of the untreated, raised surface areas. With the aid of a suited material-removing tool, for example a surface saw or a milling or abrading head, preferably linear cuts can be worked into the raised surface region by moving the tool with a given cutting depth, maximally extending to the plane of the surface region of reduced thickness, laterally to the raised surface and removing the surface of reduced thickness locally. Yielded are through-going impressions extending from one side of the lateral boundary area of the raised surface region to the opposite side, respectively to another point. If, for example, linear saw tools are used, impressions running linearly in the raised surface region can be worked in. These impressions can be oriented parallel to each other or crossing each other at given angles forming a type of lattice. Moreover, incisions can also be worked into the raised surface region along a given course of a curve by treating the raised surface region with a machine-driven milling head or suited abrading means. In addition to forming practically any desired pattern yielded by structuring the raised surface region, the width with which the single line-like impressions are executed can be set as desired. This can be obtained, for example, by running the employed material removing tool line-offset twice or multiple times along a cutting trajectory. However, the object is, apart from the aforedescribed great variety of structuring, to always select a structural depth that is shallower than or the same depth as the thickness that the edge region was thinned. In this manner, further material removal is avoided, in particular, in that edge region.

Following the aforedescribed structuring process, the surface of the structured raised surface region of the semiconductor planar substrate is brought into contact with the glasslike planar substrate in such a manner that the glasslike planar substrate at least partially extends over the planar surface region of reduced thickness. An alternative variant of the method provides for metallizing the planar surface region of reduced thickness before applying the glasslike surface substrate. This has particular advantages for creating electrically conducting conduits, which will be dealt with in more detail further on herein.

Preferably, the glasslike planar substrate is dimensioned in such a manner that it completely covers the prestructured semiconductor planar substrate including the edge region of reduced thickness. Particularly suited for joining the two planar substrates firmly and intimately as possible are anodic bonding and thermal bonding, creating a hermetically sealed bond between the two planar substrates. Feasible is also just placing the two substrates on top of each other, the two substrates also adhering to each other to a certain extent in a gas-tight manner due to the surface adhesive forces generated with corresponding coinciding contours.

However, anodic bonding results in a highly qualitative gas-tight bond and has been known since the 1960s. In it two highly planar substrates, usually comprising a metal substrate and an insulator substrate, are heated on a so-called "hot plate". In the preceding instance, the semiconductor substrate and the glasslike substrate are joined. In addition, a voltage of up to 1000V is applied between the two surface substrates. If the negative pole is situated at the glasslike surface substrate, the positive, mobile ions in the glasslike matrix wander in the direction of the cathode. The immobile, and thus locally fixed oxygen ions form a negative volume charge zone at the boundary to the semiconductor. On the one hand, the resulting electrostatic force leads to a close contact between the two substrate surfaces. On the other hand, the strong electrical field at the interface between the semiconductor planar substrate, for example a silicon wafer, and the glass releases an electrochemical reaction in the course of which an oxide is formed, which joins the two substrates at their interface.

In anodic bonding of Si and glass, a borosilicate glass (Pyrex™, Borofloat™), which largely adapts to silicon with regard to the thermal expansion coefficient, is used as the glasslike planar substrate. However, in this method the two disk-shaped materials are stacked in a vertical composite (simple or multiple).

It is to be noted that although the semiconductor planar substrate and the glasslike planar substrate are joined in an intimate and gas-tight manner along the surface of the structured raised surface region, the glasslike planar substrate extends over the edge region of reduced thickness of the semiconductor planar substrate spaced apart in height by the amount the edge region was reduced in thickness in such a manner that especially in this edge region the two planar surfaces do not enter a gas-tight, intimate bond, which is important and essential, as will be shown, for the further steps of the method.

In the following tempering step which aforedescribed joined planar substrates undergo, the completely gas-tight sealing of the two planar substrates occurs in a first tempering step. Thus the glasslike substrate lying on the semiconductor substrate and joined therewith in the raised, structured surface region thereof is tempered under vacuum conditions, preferably in a vacuum oven, in such a manner until the flow temperature of the glasslike material is reached. Preferably in this stage, the extending edge region of the glasslike planar substrate begins to sink to finally enter an intimate and gas-tight bond with the edge region of reduced thickness of the semiconductor planar substrate, the flowable, sinking glasslike material also encompassing the lateral boundary area of the raised planar surface region having openings to the single impressions placed therein.

The sinking of the edge region of the glasslike planar substrate can preferably be aided and accelerated by a load, for example in the form of a ring-shaped weight, preferably composed of graphite, acting on the extending glasslike edge in addition to its own weight.

After the glass edge has completely contacted the edge of the semi-conductor substrate of reduced thickness and thus the structures, respectively the impressions, have been hermetically sealed in the semiconductor planar substrate, a second tempering step under normal pressure, respectively under raised pressure, follows. In this manner the intermediate spaces of the silicon wafer are completely filled by the glasslike substrate.

By means of an oven process, which occurs under normal conditions, the glass material heated to the plastic range above the glass temperature $T_G$ completely fills the structural openings, respectively the impressions in the semiconductor planar substrate. Following corresponding cooling of the two intimately joined planar substrates whose thermal expansion behavior is similar or even identical, as a result of which only minimal or no thermal tensions arise, the glasslike planar substrate has the negative form of the structure of the semiconductor planar substrate.

Then the surface of the glasslike planar substrate is abraded down to the prestructured semiconductor surface and polished, for example by means of chemo-mechanical polishing, in such a manner that after completion of this processing step a composite planar substrate is yielded, in which glass or a glasslike material having structural dimensions hitherto only achievable in semiconductor materials, in particular monocrystalline silicon.

In further advantageous processing steps, the rear side of the semiconductor planar substrate is processed in that the excess semiconductor material, for example the silicon, is also removed by means of abrasion or polishing, thus remaining is a substrate that is composed in certain areas of semiconductor material and in others of the glasslike material.

In addition, the semiconductor material can be removed in a further etching process in order to obtain very narrow holes or perforations in the glasslike substrate. Further mechanical abrasion and polishing procedures can follow to open the perforations precisely, respectively in order to obtain corresponding opening contours.

Thus, by utilizing the flow properties of glass in a heated state, the planar surface topography can be exactly transferred from a structured semiconductor planar substrate, for example in the form of a silicon master, into glasslike materials, thereby yielding considerable advantages in fabrication and regarding precision. In this way, the advantages of silicon technology (exact form-giving behavior down to the sub-µm range, variety of structuring possibilities) can be combined with the good material properties of glass.

If the structural height in the original semiconductor planar substrate is sufficiently high and molding in the glasslike planar substrate by means of a suited glass flow process is complete, areas can be created that extend completely through the new composite substrate. Depending on areal distribution, glass wafers with silicon conduits or silicon wafers with glass windows can be created in this manner.

An especially important aspect is the very good thermal compatibility of the materials used, for example silicon and glass (borosilicate glasses such as for example Pyrex®, Tempax® and Borofloat glass). Due to the nearly perfect coincidence of the thermal expansion coefficients of silicon and Pyrex glass®, a thermally homogeneous substrate can be produced. In particular, in this manner no effects from thermally induced stress occur, such as a tendency of the substrates to crack or deform.

The thickness of the two planar substrates lies typically between 0.1 mm and 1 mm. It is particularly pointed out that the lateral geometry of the segmentation of the semiconductor planar substrate and the glasslike planar substrate is not subject to any principal limitations. The regions of different materials may be continuous or non-continuous.

BRIEF DESCRIPTION OF THE DRAWINGS

The present invention is described in the following using preferred embodiments with reference to the drawings by way of example without the intention of limiting the scope or spirit of the overall inventive idea.

WAYS TO CARRY OUT THE INVENTION, COMMERCIAL APPLICABILITY

FIGS. 1a-g show schematically the production steps of the invented method.

In FIG. 1a, in preparation of the method, the thickness along the edge region 2 of the semiconductor planar substrate 1 is reduced. The edge region 2 of reduced thickness of a semiconductor planar substrate designed as a Si-wafer has an edge width b of approximately up to 4 mm. Based on a typical wafer thickness of approximately 800 µm, thickness removal in the edge region 2 of the wafer of up to 500 µm leaves a remaining wafer thickness of approximately 300 µm in the edge region 2 of reduced thickness. The raised planar surface region 3 of wafer 1 is surrounded by a lateral boundary area 4 which is positioned perpendicular relative to the surface of edge region 2 or, as in FIG. 1a, diagonal to the surface of the edge region 2.

The reduction thickness occurs preferably by means of a wet chemical etching process, for example by means of KOH.

FIG. 1b shows, placed in the raised surface region, a multiplicity of impressions, respectively incisions 5, extend open through the lateral boundary area 4. The incisions are usually worked into the raised surface region 3 by means of sawing or milling. It is essential that the maximum depth of the incisions 5 is shallower than or the same depth as the plane of the surface of reduced thickness.

In FIG. 1c, the glasslike planar substrate 6 is intimately joined onto the previously prestructured semiconductor planar substrate 1 by means of anodic bonding, the two planar substrates enclosing an intermediate volume given by the geometry of the impressions 5 in the surface of the semiconductor planar substrate. The size of the glasslike planar substrate is selected in such a manner that the edge region of the glasslike planar substrate 6 extends over the edge region 2 of reduced thickness. As an alternative to anodic bonding, which is usually conducted at temperatures of approximately 400-500° C. and in which an electrical voltage is applied between the to-be-joined surfaces, also suited for joining the glasslike planar substrate and the prestructured semiconductor planar substrate is thermal bonding, in which the to-be-joined planar substrates are joined at temperatures of approximately 1000° C. and under pressure. Although thermal bonding requires higher temperatures, the need for the to-be-joined surfaces to be plane is not as great as in anodic bonding.

In an advantageous manner, according to FIG. 1d a tempering procedure occurs under vacuum conditions, in which the glasslike material is brought via the glass temperature into a plastic range, respectively in a flowable state, in which the edge region of the glasslike planar substrate sinks slanting down onto the surface of the edge region 2 of reduced thickness and forming with it a gas-tight connection.

Then according to FIG. 1e, the tempering procedure is continued under normal or high pressure conditions due to which the glasslike material of the planar substrate sinks completely into the impressions 5. Although the driving force with which the plastic glass material is driven into the structural openings is fundamentally the vacuum enclosed inside the structural openings, the procedure can, however, be supported by high pressure conditions existent inside the tempering oven. At a constant temperature and a corresponding process period, the material properties of the glasslike planar substrate have the decisive influence on the distinctiveness and precision of the structural molding.

Following corresponding cooling of the two intimately interlaced planar substrates, material is removed by means of suited abrasion and/or polishing processes. Depending on subsequent use, the glasslike planar substrate can, according to FIG. 1f, be removed from the top in such a manner that the glasslike planar substrate is flush with the structured surface of the semiconductor planar substrate.

Finally, FIG. 1g shows the result of a further material removal process which removes the corresponding planar substrate parts extending over the structured regions (see FIGS. 1c, 1d). Yielded in this stage is an extremely finely structured glasslike planar substrate that is completely penetrated by a multiplicity of semiconductor perforations. Corresponding material removal of the projecting semiconductor material on the bottom side, according to FIG. 1g, yields a composite component which, as will be explained later herein, serves for selective electrical contacting of microelectronic components.

Alternatively both planar substrates can be separated, for example after cooling following the tempering procedure, in that a suited separation layer is placed between the two planar substrates. In particular, applying suited separation layers permits reusing the prestructured semiconductor planar substrate thereby enabling further reduction of process costs. For this, it is necessary that before joining the two planar substrates, one or a multiplicity of separation layers are placed between the two planar substrates. Fundamentally, for this there are a number of possibilities:

a) A carbon layer or diamond layer or diamond-like layer or SiC is applied on the semiconductor planar substrate, for example a Si-wafer, which prevents the glass from sticking to the silicon. Joining the Si-wafer with the glass wafer is achieved by means of a ring out of a solder joining the two wafers at the wafer edge in a vacuum tight manner. Although the solder becomes fluid at the process temperature at which the glass flows, the poor wetting of the uncoated glass layers, respectively the carbon layers, however prevents the solder from penetrating between the wafers. Separation of the two wafers can either occur solely mechanically, the solder ring can also be removed by mean of etching or the carbon layer can be removed by means of an oxidation process (approximately 400-500° C. under exposure to oxygen) between the two substrates. Before further use of the silicon wafer under circumstances this separation layer has to be applied again on the two layers.

b) A coupling agent layer composed of a suited metal, for example tantalum, is applied onto the Si-wafer. Onto this layer another metal is applied, for example tin. Tin also prevents glass from sticking to the silicon and is fluid during the glass flow process. Separation of the two wafers can either occur solely mechanically during a further tempering step above the melting point of tin or the metal is selectively etched out down to the silicon and the glass.

c) A second layer, with which the glass wafer can be directly joined (for example by means of anodic bonding) is applied onto the silicon wafer. Examples for this could be silicon, titanium, aluminum or tantalum. At the end of the entire process, this sacrificial layer is selectively removed by means of etching down to the glass or silicon. In order to prevent the original Si-wafer from being attacked, the wafer can also be provided with suited layers, for example silicon nitride or silicon carbide.

The fabrication process can be altered with suited separation layers in such a manner that the silicon wafer can be multiply utilized. Under circumstances, the separation layers have to be reapplied prior to reuse.

The structured glass wafer yielded after separation of the silicon wafer must then only be abraded on the rear side in order to obtain complete perforations. These perforations can be filled in a further process, for example galvanically with metals.

In general, in microelectronics and microsystem technology, electrical contacting of chips occurs via pads lying at the edge of the chip. In a series of applications, however, this is a drawback and therefore undesirable.

For example:

for electrical reasons, in order to reduce signal losses, for example in the case of small capacitive signals or high-frequency signals. The electrical conduit offers less serial resistance, less scattering capacity and less inductivities than contacting via the edge.

for space reasons. This particularly applies to systems in which a multiplicity of chips are combined seamlessly in an array, e.g. large area detector arrays or micromirror arrays. In these cases, the pad region has to be forfeited for the inner chips. Often there are also space problems regarding the single components, for example in medical micro probes (electrodes for stimulation or recording).

if a multiplicity of functional chips are placed on top of each other forming a stack. For example, the top level may be composed of sensors (for example optical sensors) and the signal processing electronics may lie in the chip below.

test cards comprising microcontact arrays for automatic electrical testing of chips, wafers or printed boards. In this case, through-contacting is desirable in the test cards for electrical reasons as well as for space reasons.

Particularly in these cases, through-contacting through the chip is an alternative which is possible with a glass substrate processed according to the present invention.

Figure 1:
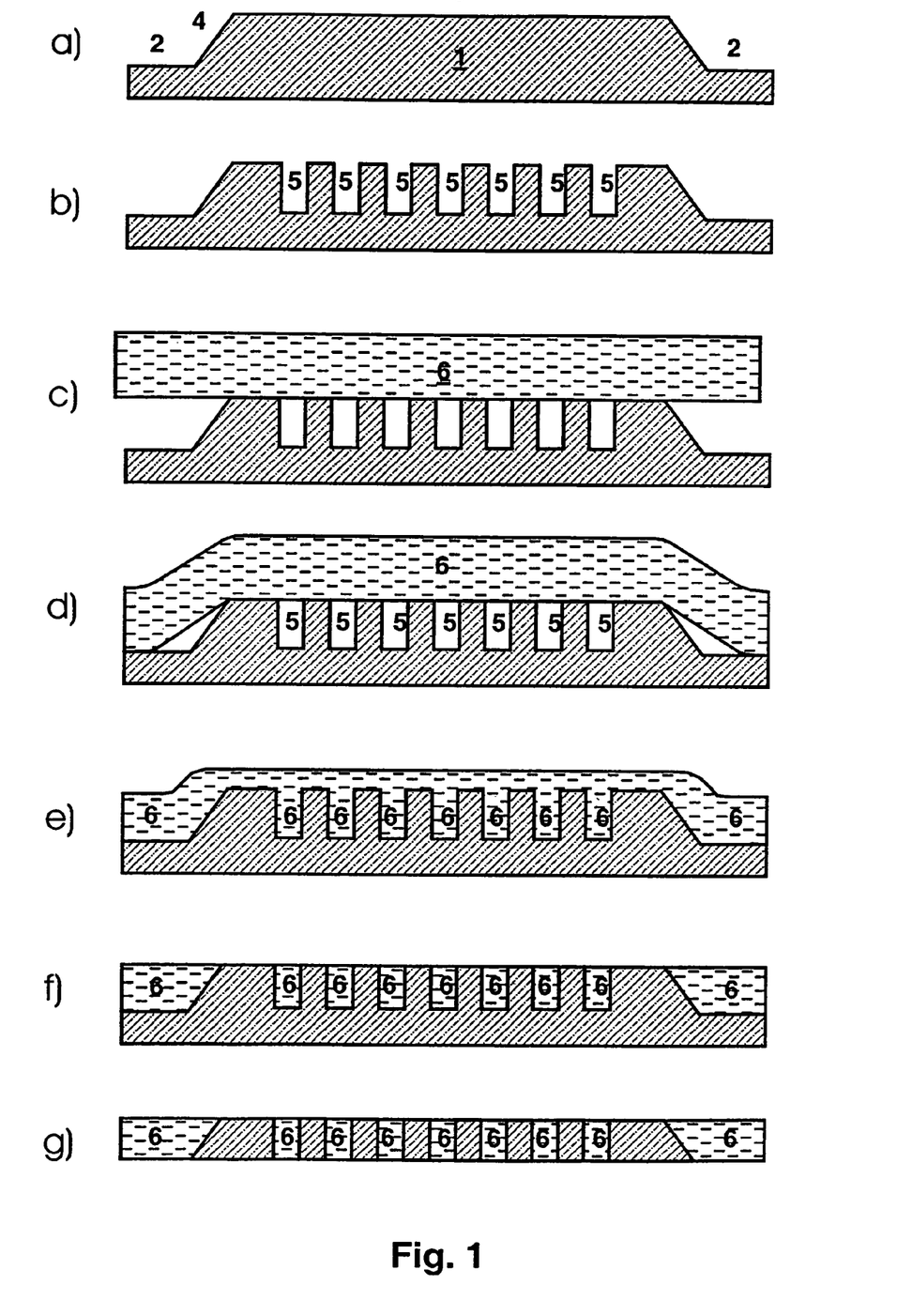
FIG. 1 shows schematically the production steps of the in invented method for producing a structured glasslike planar substrate.
Figure 2:
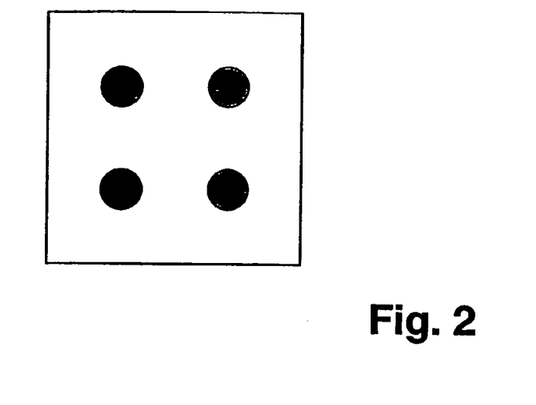
FIG. 2 shows a top view of a glasslike planar substrate having electrical conduits, FIGS. 3a,b show examples of applications for a processed glasslike planar substrate.

FIG. 2 shows a schematic top view of a processed glass wafer (white area) that is penetrated by electrical contacts (black areas). Such a type of structure is obtained in the method step according to FIG. 1g. The electrical contacts penetrating through the glass wafer may be composed of highly conductive silicon (method without a separation layer) or of metals (method with a separation layer and subsequent metallization of the open perforations inside the glass wafer).

Figure 3:
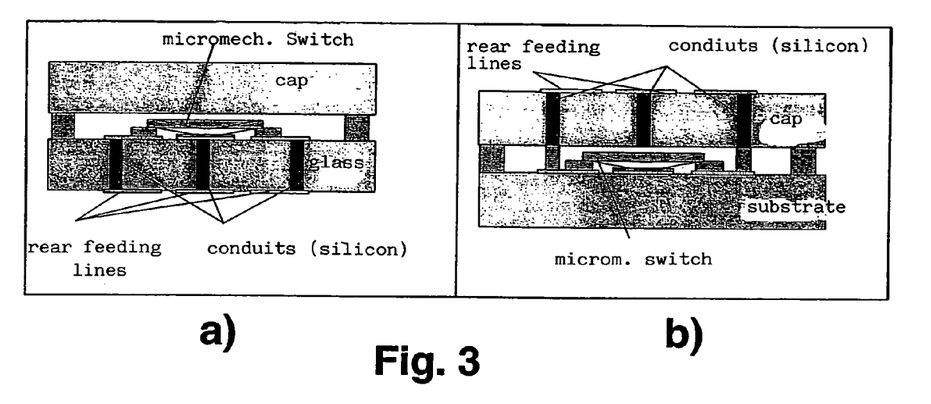

Especially advantageous seems to be the use of such structured substrates for building micromechanical components for the high-frequency range 1-100 GHz. A concrete example of this is shown in FIGS. 3a and b. In this example, a micromechanical component (micromechanical switch) is set up on a glass substrate with electrical conduits (FIG. 3a). At the end of the whole production, the entire structure is hermetically encapsulated with a cap wafer by means of a soldering process, with the electrical contacts being produced between the two wafers as well. As an alternative, the electrical contacts may also be placed in the cap (FIG. 3b).

The electrical contact areas shown in FIG. 2 can also serve to selectively remove heat. Fields of application are feasible in which heat has to be removed from certain areas in a glass substrate. The silicon conduits and metal conduits act as heat conducting paths.

Figure 4:
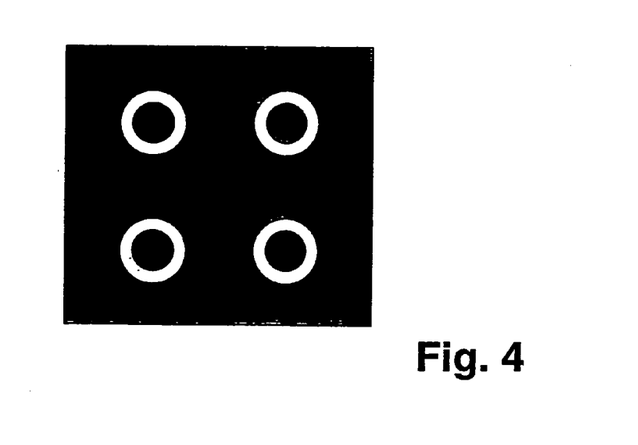
FIG. 4 shows a top view of a semiconductor planar substrate having insulated electrical conduits.

FIG. 4 shows a preferred embodiment of a silicon wafer (black areas) provided with ring-shaped glass areas (white areas) to function as insulated electrical conduits. Such a type structure can also be obtained in a somewhat modified form within the scope of the method step according to FIG. 1g. Such type silicon wafers in which glass is worked into certain areas for electrical, thermal or optical reasons are suited for numerous different applications:

Silicon Wafers with Thermally Insulated Areas

Suited for these applications are the structures according to FIGS. 1f and 1g. Thermally insulated areas on silicon wafers are especially required in thermal sensors, for example in thermopiles, bolometers, and pyroelectrical sensors. For these types of sensors, membrane structures have hitherto been generated in or on the chip to ensure thermal insulation. However for reasons of stability, these sensors are not suited for uses involving great mechanical stress.

Silicon Wafers with Optical Windows

In this case, the structures according to FIG. 1f or 1g can be employed. Possible applications are, for example, light collimators of specific shape or collimator arrays with narrow openings.

Silicon Wafers with Electrically Insulated Areas

In this case, the structures according to FIG. 1f or 1g can also be employed. In particular, passive high-frequency components (for example inductivities) or high-quality MEMS components can be placed on the glass areas. Due to losses in the substrate, high quality cannot be achieved on pure silicon substrates.

Figure 5:
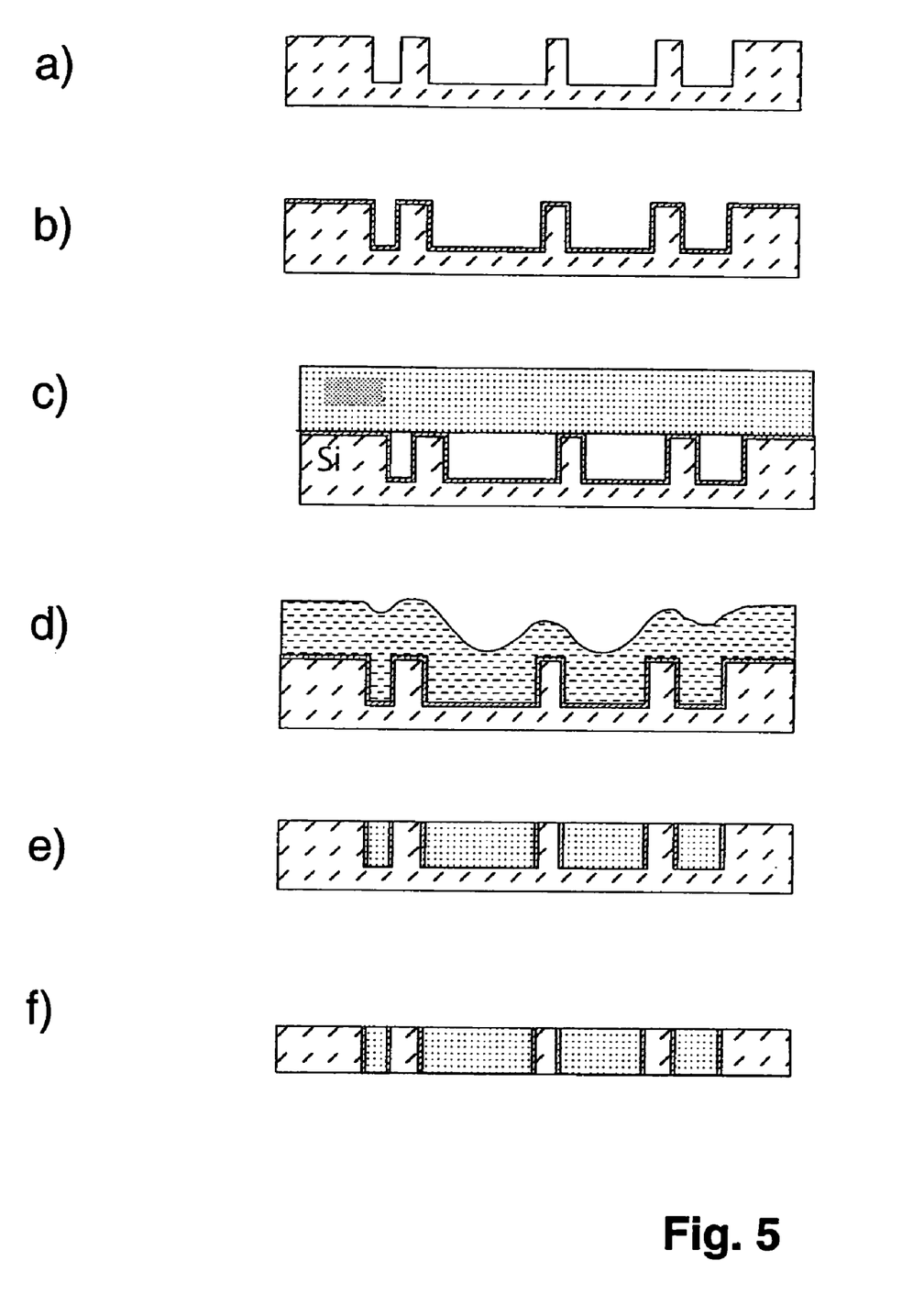
FIG. 5 shows schematically the production steps of an Alternative method, and FIGS. 6a,b show a representation of a cap wafer.

For fabricating such type silicon wafers which possess electrically conducting joining structures penetrating perpendicularly through the silicon wafer see for illustration FIG. 5, in which preferred partial process steps are shown schematically:

After finishing structuring a silicon substrate, diagonal hatching in step 5a, as in the following process steps, which preferably is conducted in the same manner as in the partial method step according to FIG. 1b, an additional metal layer (see lightly hatched layer) is applied as structurally conform as possible onto the structured silicon substrate in a subsequent step 5b. Metal deposition can occur using prior art methods for example by a vapor-deposition process. Optionally, an additional protective layer or barrier layer between the silicon substrate and the metal layer can be applied before hand, for example in the form of a thermal $SiO_2$ layer, thereby preventing reactions between the silicon and the metal.

After joining the glass wafer (see dotted layer) with the metallized substrate under vacuum conditions (process step c), the cavities enclosed between the glass wafer and the silicon substrate are filled by the glass flowing in by way of a tempering procedure, as described in the preceding (d). The projecting glass material, respectively the silicon, is then removed by abrasion and polishing both sides of the silicon substrate (see process steps e and f). The metallized areas on, respectively between, the yielded silicon conduits, respectively silicon ridges, are also removed. Left are silicon areas (silicon pins) which are reinforced by a thin metal layer and again surrounded by glass. The object is to thereby improve the relatively poor electrical conductivity of pure silicon conduits. In this manner, connecting structures for microsystem technological systems can be produced simply and cost-effectively.

Generally, the production of hermetically sealed joints on the wafer level is an important subject in microsystem technology.

At any rate, moveable microstructures have to be protected against adverse environmental conditions, preferably already at the wafer level. Apart from the cost aspect, which is in favor of encapsulation on the wafer level, protection against required separation processes play a very important role. Moreover, often hermetically tight sealing is required which harbors the problem of the electrical conduits below the sealed areas. In this context, with regard to the encapsulation of microelectronic components, the invented method aids CSP technology (chip side packaging).

The methods based on glass solders have proven good in the case of silicon sensors. However, process temperatures of approximately 400° C. are required which is definitely too high, for instance, for metallic microelements. Moreover, joining techniques based on glass solders are suited only for sealing a relatively low topography (approximately 0.5 μm).

Hermetically sealed joints at temperatures below 250-300° C. can be produced by soldering. However, here arises the problem that the feeding lines in the available insulation materials and their producible layer thickness are strongly capacitively coupled to each other. Therefore, such conduits actually are not suited for production of micromechanical components for high frequencies. Sufficient separation of the lines is only possible by using conduits running through the substrate or the cap.

In addition to the aforementioned aspects, in favor of producing conduits is better handling of the finished chips.

In particular, such type constructed components are suited for use inside flip chip processes or even using the chip directly in assembling printed boards, for example as a SMD component.

Figure 6:
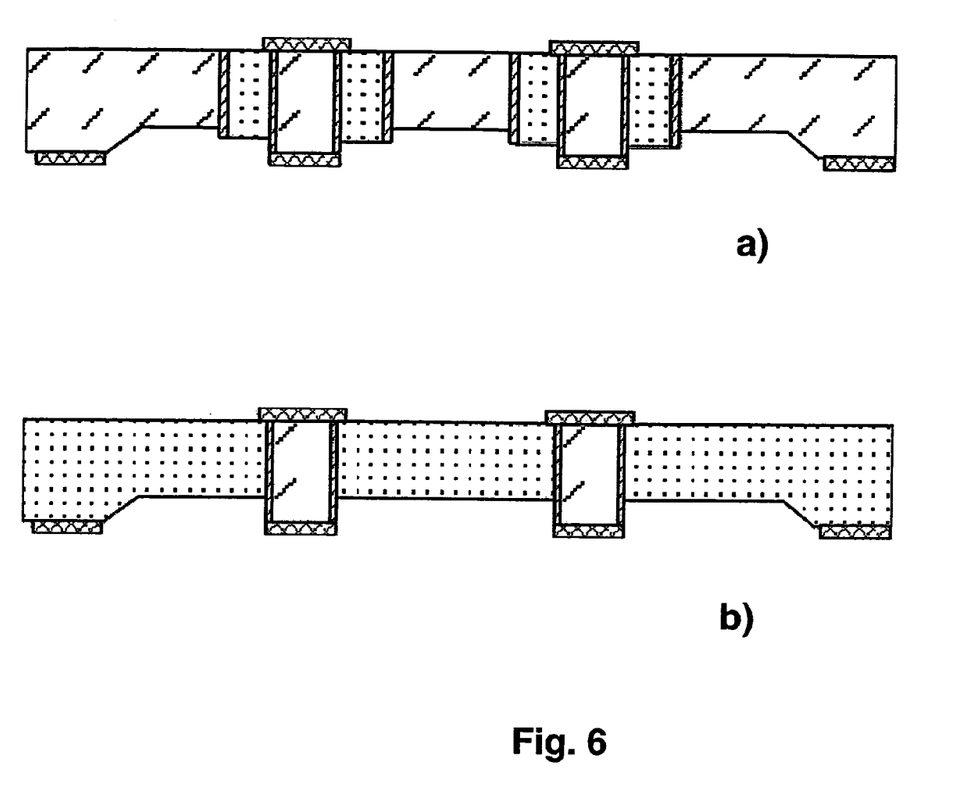

FIGS. 6a and b show possible preferred embodiments of a cap element producible with the preceding method and use of the conduits for hermetic encapsulation already at the wafer level. Encapsulation at the wafer level permits simultaneous sealing of a multiplicity of components and is therefore especially cost-effective.

Based on the described production methods of combined glass-silicon substrates, this example describes two cap wafers which are largely composed of silicon. Once again the convention applies that the hatched areas represent semiconductor areas, preferably Si, dotted areas glass areas and the light, hatched layer regions represent electrically conducting areas, for example gold.

The conduits made of silicon, depending on the requirements additionally surrounded by a metal or not, are separated from the remainder of the substrate by a wide ring made of glass, the ring typically having a thickness of 50-200 μm. After completion of the combined glass-silicon substrate, a pit is etched into the front side of the substrate in additional processing steps in order to create room for a to-be-encapsulated sensor structure and conduits coated both on the top as well as the bottom side with a metal, preferably gold. In addition, the boundary areas of the chip are provided with a ring-shaped metal layer (can under circumstances be of the same metallization as the contacts for example: gold).

Such an assembled cap wafer can then be bonded, respectively soldered, onto a sensor chip, which will not be dealt with in more detail herein. Usually, however, two chips are joined by means of wire bonding. As the connecting wires required for this, the so-called bond loop, are not always of the same geometry, the induced parasitic capacities and inductivities vary from chip to chip and thereby ultimately limit the resolution limitations of all the sensors. In comparison to this, flip-chip assembly of a sensor, for example on an ASIC, using the described cap wafer is ideal as the bonds are not only identical in geometry but also, in addition, especially short.

Furthermore, it is pointed out that the invented method permits parallel production of a multiplicity of single, structured glasslike planar substrates which, moreover, can be produced as part of a batch process, which makes the method excellently suited with regard to industrial mass production as well.

What is claimed is:

1. A method for structuring a planar substrate composed of a glasslike material,
    characterized by a combination of the following method steps:
        provision of a semiconductor planar substrate composed of a semiconductor material,
        reduction of the thickness of said semiconductor planar substrate inside at least one surface region of said semiconductor planar substrate in order to form a raised surface region in relation to said surface planar region of reduced thickness,
        structuring said raised surface region of said semiconductor planar substrate by means of local mechanical removal of material in order to place impressions inside said raised surface regions,
        joining said structured surface of said semiconductor planar substrate with said glasslike planar substrate in such a manner that said glasslike planar substrate at least partially covers said surface planar region of reduced thickness,
        tempering said joined planar substrates in such a manner that in a first tempering phase, which is conducted under vacuum conditions, said glasslike planar substrate covering said surface region of reduced thickness forms a fluid-tight bond with said surface region of reduced thickness, with said planar substrate covering said impressions in a fluid-tight manner under vacuum conditions, and that in a second tempering phase, at least partial areas of the glasslike material flow into said impressions of said structured surface of said semiconductor planar substrate.

2. The method according to claim 1,
wherein said reduction in thickness is carried out at the edge region of said semiconductor planar substrate.

3. The method according to claim 2,
wherein said reduction in thickness is carried out in such a manner that said raised surface region is limited by a boundary area and is at least partially surrounded by said edge region of reduced thickness.

4. The method according to claim 2,
wherein said reduction in thickness is conducted by means of a wet-chemical etching process or a mechanical material processing method.

5. The method according to claim 1,
wherein said structuring of said raised surface region of said semiconductor planar substrate occurs by means of local mechanical removal of material in such a manner that impressions, which have a structural depth extending maximally to the plane of said surface region of reduced thickness, are worked inside said raised surface region by means of a removal tool.

6. The method according to claim 1,
wherein a sawing, abrading or milling tool is employed as said removal tool.

7. The method according to claim 5,
wherein said removal tool is moved in relation to said semiconductor planar substrate in such a manner that for selective removal of material, said removal tool is moved laterally over the surface of said surface region of reduced thickness in said raised surface region.

8. The method according to claim 1,
wherein said removal of material results in straight or curved running impressed channels within said raised surface region.

9. The method according to claim 8,
wherein said impressed channels are open toward the surface of said raised surface region and project open through the lateral boundary wall of said raised surface region.

10. The method according to claim 1,
wherein joining said semiconductor planar substrate with said structured planar substrate occurs by means of anodic bonding or thermal bonding.

11. The method according to claim 1,
wherein during said second tempering phase, normal pressure conditions or high pressure conditions prevail, which act on the surface of said glasslike planar substrate facing away from said semiconductor planar substrate.

12. The method according to claim 1,
wherein said tempering is carried out by controlling the temperature and the duration in such a manner that said glasslike material stops flowing into said impressions in said semiconductor planar substrate when said glasslike material completely fills said impressions.

13. The method according to claim 1,
wherein following said tempering, two-dimensional removal of material is carried out in such a manner that said glasslike planar substrate assumes a flush adjoining surface to said structured surface of said semiconductor planar substrate.

14. The method according to claim 1,
wherein semiconductor material is removed from the surface of said semiconductor planar substrate facing the surface joined with said glasslike planar substrate until at least partial areas of said glasslike material which flowed into said impressions are uncovered, said partial areas being flush with said surface of said semiconductor planar substrate.

15. The method according to claim 1,
wherein said semiconductor material is separated from said glasslike planar substrate.

16. The method according claim 15,
wherein said separation of said glasslike planar substrate from said semiconductor planar substrate occurs by means of etching away said semiconductor material.

17. The method according to claim 15,
wherein said separation of said two planar substrates occurs by providing a separation layer between said two planar substrates.

18. The method according to claim 17,
wherein said separation layer is applied onto said structured surface of said semiconductor planar substrate before joining said two planar substrates in a structure-retaining manner and is designed as a sacrificial layer which is destroyed by means of thermal and/or chemical action and permits separating said two substrates.

19. The method according to claim 17,
wherein a metal layer which has a melting point which lies below the melting points of said substrates is utilized as said separation layer.

20. The method according to claim 17,
wherein a layer capable of oxidizing which changes chemically under the addition of oxygen and/or thermal energy is utilized as said separation layer.

21. The method according to claim 17,
wherein a carbon layer, diamond layer, diamond-like layer or SIC is utilized as said separation layer.

22. The method according to claim 15,
wherein after separation of said two planar substrates from each other, said glasslike planar substrate is finished mechanically in order to retain said perforations penetrating perpendicularly through said planar substrate.

23. The method according to claim 22,
wherein said perforations are filled with an electrically conductive material.

24. The method according to claim 1,
wherein said glasslike material and said semiconductor material posses almost the same thermal expansion coefficients.

25. The method according to claim 1,
wherein said planar substrate composed of a glasslike material is a borosilicate glass.

26. The method according to claim 1,
wherein said semiconductor planar substrate is a silicon substrate.

27. The method according to claim 1,
wherein said structuring of said semiconductor planar substrate results in impressions of structural dimensions in the micrometer and/or sub-micrometer range.

28. The method according to claim 1,
wherein said impressions have an aspect ratio (height, respectively depth:width) of 10:1.

29. A glasslike planar substrate produced according to the method according to claim 1,
wherein said glasslike planar substrate is penetrated perpendicular to the substrate surface by perforations in which electrically conductive material is provided.

30. The glasslike planar substrate according to claim 29,
wherein said perforations filled with electrically conductive material are arranged arraylike.

31. Use of said glasslike planar substrate according to claim 29 for electrical contacting of components in microelectronics or micromechanics.

32. The use of said method according to claim 1 for producing a semiconductor planar substrate penetrated by a glasslike material.

33. A semiconductor planar substrate produced according to claim 32,
wherein said semiconductor planar substrate is a silicon wafer which, for the purpose of electrical and/or thermal insulation or for reasons of optical transparency, is provided with areas of glasslike material at least partly penetrating said silicon wafer.

34. The semiconductor planar substrate according to claim 32,
wherein said areas of glasslike material which at least partly penetrate said silicon wafer enclose at least one semiconductor region, and
wherein a metal layer is provided at least between said enclosed semiconductor region and said areas of glasslike material.

35. The semiconductor planar substrate according to claim 34,
wherein said enclosed semiconductor region is covered on both sides with an electrode structure respectively, each of which contacting said metal layer enclosing said semiconductor region.

36. A method for structuring a planar substrate composed of a glasslike material,
characterized by a combination of the following methods steps:
provision of a semiconductor planar substrate composed of a semiconductor material,
reduction of the thickness of said semiconductor planar substrate inside at least one surface region of said semiconductor planar substrate in order to form a raised surface region in relation to said surface region of reduced thickness,
structuring of said raised surface region of said semiconductor planar substrate by means of local mechanical removal of material in order to place impressions inside said raised surface region,
structurally conform deposition of a metal layer onto said structured, raised surface region, joining said structured, metallized surface with said glasslike planar substrate in such a manner that said glasslike planar substrate at least partially covers said surface region of reduced thickness, tempering said joined planar substrates in such a manner that in a first tempering phase, which is conducted under vacuum conditions, said glasslike planar substrate covering said surface region of reduced thickness forms a fluid-tight bond with said surface region of reduced thickness, with said planar substrate covering said impressions under vacuum conditions in a fluid-tight manner, and that in a second tempering phase, at least partial areas of said glasslike material flow into said impressions of said structured, metallized surface of said semiconductor planar substrate.

37. The method according to claim 36, wherein before structurally conform deposition of said metal layer on said structured raised surface region, a protective layer is deposited on said semiconductor planar substrate in order to prevent reactions between said semiconductor planar substrate and said metal layer.

38. The method according to claim 37, wherein thermal $SiO_2$ is deposited as said protective layer.

39. The method according to claim 36, wherein before joining said structured, metallized surface with said glasslike planar substrate, at least partial areas of said metallized surface are removed.

* * * * *